(12) United States Patent
Beitel et al.

(10) Patent No.: US 6,821,187 B2
(45) Date of Patent: Nov. 23, 2004

(54) METHOD FOR CHEMICAL-MECHANICAL POLISHING OF A LAYER WHICH IS A SUBSTRATE AND IS A METAL SELECTED FROM A PLATINUM GROUP

(75) Inventors: Gerhard Beitel, Kamakura (JP); Annette Saenger, Dresden (DE); Gerd Mainka, Nauheim (DE); Rainer Florian Schnabel, Hoehenkirchen (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/148,241
(22) PCT Filed: Sep. 25, 2001
(86) PCT No.: PCT/EP01/11071
§ 371 (c)(1),
(2), (4) Date: Oct. 15, 2002
(87) PCT Pub. No.: WO02/26906
PCT Pub. Date: Apr. 4, 2002

(65) Prior Publication Data
US 2003/0092360 A1 May 15, 2003

(30) Foreign Application Priority Data
Sep. 29, 2000 (DE) .......................................... 100 48 477

(51) Int. Cl.[7] .......................................... H01L 21/4763
(52) U.S. Cl. ............................ 451/5; 451/41; 451/56; 451/57; 438/691
(58) Field of Search .............................. 451/5, 41, 56, 451/57, 285–290; 438/691–693, 689, 690

(56) References Cited

U.S. PATENT DOCUMENTS

| 5,527,423 A | | 6/1996 | Neville et al. |
|---|---|---|---|
| 5,783,489 A | | 7/1998 | Kaufman et al. |
| 5,863,838 A | | 1/1999 | Farkas et al. |
| 5,935,871 A | * | 8/1999 | Farkas et al. ................ 438/693 |
| 5,976,928 A | | 11/1999 | Kirlin et al. |
| 6,063,306 A | | 5/2000 | Kaufman et al. |
| 6,071,816 A | * | 6/2000 | Watts et al. ................ 438/692 |
| 6,290,736 B1 | | 9/2001 | Evans |
| 6,419,554 B2 | * | 7/2002 | Chopra et al. ................ 451/41 |
| 6,420,269 B2 | * | 7/2002 | Matsuzawa et al. ........ 438/693 |
| 6,436,811 B1 | * | 8/2002 | Wake et al. ................ 438/633 |
| 6,461,675 B2 | * | 10/2002 | Paranjpe et al. ............ 427/250 |
| 6,653,242 B1 | * | 11/2003 | Sun et al. .................... 438/738 |

FOREIGN PATENT DOCUMENTS

| DE | 199 27 286 | 1/2001 |
|---|---|---|
| EP | 0 773 269 | 5/1997 |
| EP | 0 831 136 | 3/1998 |
| EP | 1 156 091 | 11/2001 |

* cited by examiner

Primary Examiner—Joseph J. Hail, III
Assistant Examiner—Anthony Ojini
(74) Attorney, Agent, or Firm—Schiff Hardin LLP

(57) ABSTRACT

The invention discloses a method for the chemical-mechanical polishing of layers composed of metals of the group of platinum metals, particularly iridium. In the CMP process, high erosion rates for iridium and a high selectivity relative to silicon oxide are achieved upon employment of a polishing fluid that contains 1 through 6% by weight abrasive particles, 2 through 20% by weight of at least one oxidation agent selected from the group comprising Ce(IV) salts, salts of chloric acid, salts of peroxodisulfuric acid, hydrogen peroxide and salts of hydrogen peroxide, and 74 through 97% by weight water. This enables the structuring of iridium layers with the assistance of an oxide mask and a CMP process.

20 Claims, 3 Drawing Sheets

METHOD FOR CHEMICAL-MECHANICAL POLISHING OF A LAYER WHICH IS A SUBSTRATE AND IS A METAL SELECTED FROM A PLATINUM GROUP

This application is a 371 of PCT/EP01/11071 Sep. 25, 2001.

BACKGROUND OF THE INVENTION

The invention is directed to a method for chemical-mechanical polishing of layers composed of metals from the group of platinum metals, particularly iridium. The invention is also directed to a method for planarizing and/or structuring a metal layer composed of a metal from the platinum group, particularly iridium.

In order to be able to reproducibly read out the charge stored in a storage capacitor of a memory cell, the capacitance of the storage capacitor should have a value of at least approximately 30 fF. At the same time, the lateral expanse of the capacitor must be constantly reduced for the development of DRAM memory cells in order to be able to achieve further enhancements of the storage densities. These inherently contradictory demands made on the capacitor of the memory cell lead to more and more complex structuring of the capacitor ("trench capacitors", "stack capacitors", "crown capacitors"). Accordingly, the manufacture of the capacitor becomes more involved and, thus, more and more expensive.

Another way of assuring adequate capacitances of the storage capacitors is by employing materials having an extremely high dielectric constant between the capacitor electrodes. Recently, new materials, particularly high-$\epsilon$ para-electrics and ferro-electrics, are therefore being employed as a dielectric instead of the traditional silicon oxide/silicon nitride, and these have a clearly higher, relative dielectric constant (>20) than the traditional silicon oxide/silicon nitride (<8). Given the same capacitance, the capacitor area and, thus, the required complexity of the structuring of the capacitor can thus be clearly diminished. Significant representatives of these materials are barium strontium titanate (BST), which has a formula of $(Ba, Sr)TiO_3$, lead zirconate titanate (PZT), which has a formula of $Pb(Zr,Ti)O_3$ or, respectively, lanthanum-doped lead zirconate titanate or strontium bismuth tantalate (SBT), which has the formula $SrBi_2Ta_2O_9$.

In addition to traditional DRAM memory modules, ferro-electric memory arrangements, what are referred to as FRAMs, will also play an important art in the future. Compared to traditional memory arrangements such as, for example, DRAMs and SRAMs, ferro-electric memory arrangements have the advantage that the stored information is not lost but remains stored even given an interruption of the voltage supply or, respectively, the power supply. This non-volatility of the ferro-electric memory arrangements is based on the fact that the polarization impressed by an external electrical field in the ferro-electric materials is also essentially retained even after the external electrical field is shutoff. The new materials such as lead zirconate titanate (PZT), $(Pb (Zr, Ti)O_3)$ or, respectively, lanthanum-doped lead zirconate titanate or strontium bismuth tantalate (SBT), $(SrBi_2Ta_2O_9)$ are also utilized for the ferro-electric memory arrangements.

Unfortunately, the employment of the new para-electrics or, respectively, the ferro-electrics requires the employment of new electrode materials and barrier materials. The new para-electrics or, respectively, ferro-electrics are usually deposited on electrodes (lower electrode) that are already present. The processing ensues under high temperatures at which the materials which normally make up the capacitor electrodes, thus, for example, doped polysilicon, are easily oxidized and lose their electrically conductive properties, which would lead to the failure of the memory cell.

Due to their good oxidation resistance and/or the formation of electrically conductive oxides, 4d and 5d transition metals, particularly platinum metals such as Ru, Rh, Pd, Os, Pt and, particularly, Ir or, respectively, $IrO_2$, are considered promising candidates that could replace the doped silicon/polysilicon as electrode material and barrier material.

Unfortunately, the aforementioned electrode and barrier materials, which are newly utilized in integrated circuits belong to a class of materials that are extremely difficult to structure. Due to their chemically inert nature, they are very difficult to etch, so that the etching erosion, even given the employment of "reactive" gases, is based mainly or almost exclusively on the physical part of the etching. For example, iridium was previously usually structured with a dry-etching process. A significant disadvantage of this process is the lack of selectivity of the method which is caused by the high physical part of the etching. This results therein that only a slight trueness to dimension of the structures can be assured due to the erosion of the masks, which have unavoidably inclined sidewalls. Over and above this, undesired re-depositions on the substrate, on the mask or in the unit employed will occur.

Over and above this, these materials also prove extremely resistant given the employment of what are referred to as CMP processes (chemical mechanical polishing).

In typical CMP processes, a semiconductor wafer whose surface is to be polished is applied on a wafer carrier and is pressed by this onto an elastic, perforated support (polishing pad) that is attached on a polishing table. The semiconductor wafer and the polishing table and, thus, the polishing support thereby rotate in opposite direction. The polishing support contains a polishing agent (slurry) that also contains active chemical additives in addition to polishing bodies.

CMP standard methods for planarization and structuring of metal surfaces exist, for example, for tungsten and copper as well as for the materials employed as barrier layer such as Ti, TiN, Ta and TaN. The CMP processes for planarization of polysilicon, silicon oxide and silicon nitride are also in the prior art.

Such methods are disclosed, for example, in U.S. Pat. Nos. 5,527,423, 5,976,928 and 5,863,838. 5,783,489 discloses a method for eroding layers of titanium, titanium nitride and aluminum alloys. In this method, polishing agents are utilized that, in addition to containing water, contain an abrasive, for example aluminum oxide, two different oxidation agents, including, among other things, peroxide disulfate (ammonium per sulfate) and hydrogen peroxide, and a stabilizer such as, for example, various phosphone acid derivatives.

The polishing fluids employed in these methods, however, are not considered suitable for the erosion of precious metal layers due to the chemical inertness and difficult oxidizability of the precious metals and their oxides such as Pt, Ir or $IrO_2$. Methods for chemical-mechanical polishing of layers composed of metals from the group of the platinum metals, particularly iridium, have thus not yet been disclosed.

SUMMARY OF THE INVENTION

The present invention is therefore based on the object of offering a method for chemical-mechanical polishing with which layers of metals from the group of platinum metals, particularly iridium, can be polished or, respectively, eroded and/or structured and that assures an adequately high erosion rate.

This object is achieved by a method for chemical-mechanical polishing of layers composed of metals from the platinum metals, particularly iridium with a polishing fluid. Further, a method for planarizing and/or structuring layers composed of metals from the platinum metals, particularly iridium is also disclosed. Further advantageous embodiments, developments and aspects of the present invention will be apparent from the claims, from the specification and from the attached drawings.

Inventively, a method is offered for chemical-mechanical polishing of layers composed of metals from the group of platinum metals, particularly iridium, that comprises the following steps: preparing a layer of a metal of the platinum group; preparing a polishing fluid that contains 1 through 6% by weight abrasive particles; contains 2 through 20% by weight of at least one oxidation agent that is selected from the group consisting of Ce(IV) salts, salts of chloric acid, salts of peroxodisulfuric acid and hydrogen peroxide as well as the salts of hydrogen peroxide; and contains 97 through 74% by weight water. The metal layer is chemical-mechanically polished with the assistance of the polishing fluid.

The inventive method offers a method in which the material erosion of the layer to be polished ensues by chemical and mechanical erosion and not merely by means of a chemical etching. As a result thereof, the utilization of chemical-mechanical polishing for a structuring reaction-inert and oxidation-resistant metal layers such as layers composed of metals from the platinum group, particularly iridium is enabled. With the method, for example, erosion rates of 30 through 60 nm/min can be achieved, for example, for iridium layers. The re-polishing of iridium layers having thicknesses of between 50 and 150 nm typical for memory manufacture can thus be accomplished in less than three minutes. The erosion rate of iridium in the inventive method is significantly higher than that of silicon dioxide. As a result thereof, a silicon dioxide mask can be utilized in the structuring of an iridium layer without this being significantly eroded in the CMP step and losing its dimensional precision due to the edge slope.

Over and above this the polishing fluid employed in the method exhibits only slight corosivity and thus enables the utilization of traditional materials and utensils, which are regularly utilized for chemical-mechanical polishing.

The inventive CMP method achieves surface roughnesses that are comparable to those of an already established Cu-CMP process. Thus, the roughness usually amounts to about 0.5 through 2 nm and the maximum depth of scratches is approximately 5 through 15 nm.

The abrasive particles preferably exhibit a Mohs hardness of more than 7. When the inventive method is employed for chemical-mechanical polishing of iridium, it is preferred when the abrasive particles exhibit a Mohs hardness of more than 9. The term "Mohs hardness" as employed in this application refers to the hardness classification of hard materials according to the Mohs's hardness scale.

In a preferred embodiment of the present invention, the polishing fluid additionally comprises 2 through 10% by weight of a stabilizer selected from the group consisting of polyacrylic acid and derivatives of phosphonic acid. This stabilizer assures a stable suspension of the abrasive in the polishing fluid. The proportion of the stabilizer in the polishing fluid preferably amounts to between 2 and 5% by weight, and particularly 3% by weight. Polyacrylic acid having a mol weight of 500 through 10000 g/mol, preferably 1000 through 5000 g/mol, and particularly approximately 2000 g/mol, is preferably utilized as the stabilizer.

In a preferred embodiment of the invention, abrasive particles are selected from the group comprising a-aluminum oxide and/or diamond. In general, abrasive particles of one type or mixtures from the various suitable types of abrasive particles can be employed in the inventive method. The proportion of abrasive particles in the polishing solution preferably amounts to between 1 and 3% by weight, and particularly 1% by weight. The abrasive particles utilized in the inventive method preferably have a diameter of less than approximately 1 $\mu$m.

In other preferred embodiments of the inventive method, the Ce(VI) salt, for example ammonium cerium nitrate, $(NH_4)_2Ce(NO_3)_6$, is employed as the oxidation agent. In this case, the polishing fluid preferably contains 5 through 20% by weight, and preferably 7 through 15% by weight, and particularly 10% by weight, of the oxidation agent.

The employment of potassium chlorate, $KClO_4$, as the oxidation agent is likewise preferred. In this case, a proportion of up to 15% by weight, preferably 5 through 10% by weight, and particularly 10% by weight potassium chloride is preferred in the polishing fluid. In the embodiments of the inventive method wherein salts of peroxodisulfuric acid are employed as the oxidation agent, the employment of ammonium peroxide disulfate, $(NH_4)_2S_2O_8$, is preferred. A proportion of 2 through 10% by weight, preferably 5 through 10% by weight, and particularly 10% by weight of the oxidation agent in the polishing fluid is thereby preferred.

When hydrogen peroxide, $H_2O_2$, is utilized in the inventive method as the oxidation agent, then the proportion thereof in the polishing fluid preferably amounts to 2 through 10% by weight, and particularly 5% by weight.

In another advantageous development of the inventive method, the pH value of the polishing fluid is greater than 1; a pH value of between 2 and 12 is preferred; and a pH value of between 4 and 9 is especially preferred.

The chemical-mechanical polishing step in the inventive method is preferably implemented given a polishing pressure of 20.7 through 82.8 kPa (3 through 12 psi), preferably 34.5 through 69 kPa (5 through 10 psi), and particularly 41.4 through 55.2 kPa (6 through 8 psi) with an additional pressure onto the backside of the wafer (back-pressure) of 0 through 34.5 kPa (0 through 5 psi), and particularly 20.7 through 27.6 kPa (3 through 4 psi). The velocities of the wafer carriers and of the polishing plate employed in the chemical-mechanical polishing step of the inventive method preferably amounts to 20 through 70 rpm; preferably 40 through 70 rpm, and particularly 60 through 70 rpm. The flow rate of the polishing fluid onto the surface of the substrate to be polished preferably amounts to 50 through 150 ml/min, and particularly 60 through 100 ml/min, during the chemical-mechanical polishing.

Inventively, a method is also offered for planarization and/or structuring of a metal layer composed of a metal for the platinum group, particularly iridium, that comprises the following steps: preparing a pre-structured substrate; applying a metal layer composed of a metal from the platinum group, particularly iridium on the surface of the substrate, at least in sub-regions thereof and planarizing and/or structuring the metal layer composed of the metal of the platinum group according to the method for chemical-mechanical polishing of layers composed of metals from the platinum metals, particularly iridium.

This inventive method offers the advantage that electrodes and barriers for highly integrated DRAMs of platinum metals, particularly iridium, can also be structured with CMP steps while avoiding dry-etching steps. Due to the high selectivity of the CMP steps between iridium and silicon dioxide, this can be set such that it has nearly ended as soon as the mask surface of silicon dioxide has been reached. When the CMP process is ended at this point in time, then the iridium layer to be structured is obtained such as prescribed by the mask surface. Geometry distortions due to chemical or mechanically attaching of the silicon dioxide masks are largely precluded.

DESCRIPTION OF THE PREFERRED EMBODIMENTS

FIGS. 1 through 7 show the process steps of an embodiment of the method for structuring an iridium layer with the assistance of the CMP process for the manufacture of a barrier layer for DRAM/FeRAM storage capacitors.

Figure 1:
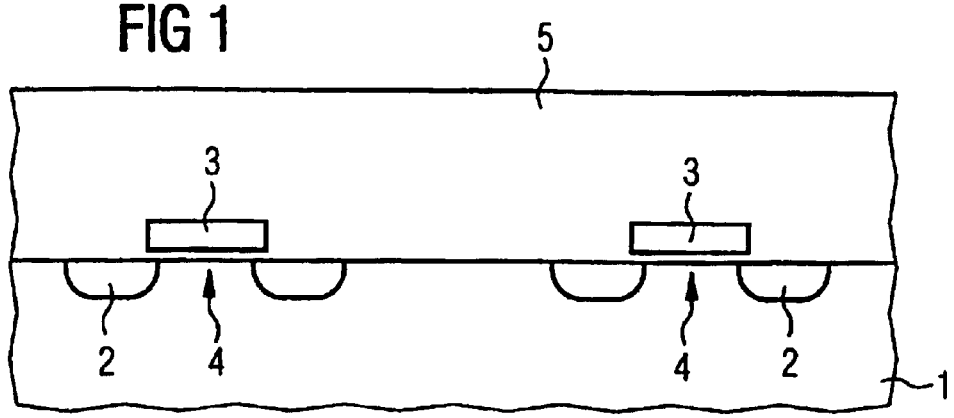
FIGS. 1–7 show the process steps of an inventive method for structuring an iridium layer.

First, a silicon substrate 1 having field effect transistors 4 that have already been finished is prepared, this respectively comprising two diffusion zones 2 and a gate 3 (FIG. 1). Whereas the diffusion zones together with the transistor channel are arranged at the surface of the substrate, the gate 3 is separated from the channel via a gate oxide. The conductivity of the transistor channel between the two diffusion zones can be controlled via the gate 3. Together with the storage capacitors that are yet to be produced, the transistors respectively form a binary memory cell. The transistors 4 are produced according to methods known from the prior art that are not explained in detail here.

An insulating layer 5, for example a $SiO_2$ layer, is applied onto the silicon substrate 1 with the transistors 4. Dependent on the method employed for the manufacture of the transistors 4, a plurality of insulating layers can also be applied. The structure deriving therefrom is shown in FIG. 1.

Figure 2:
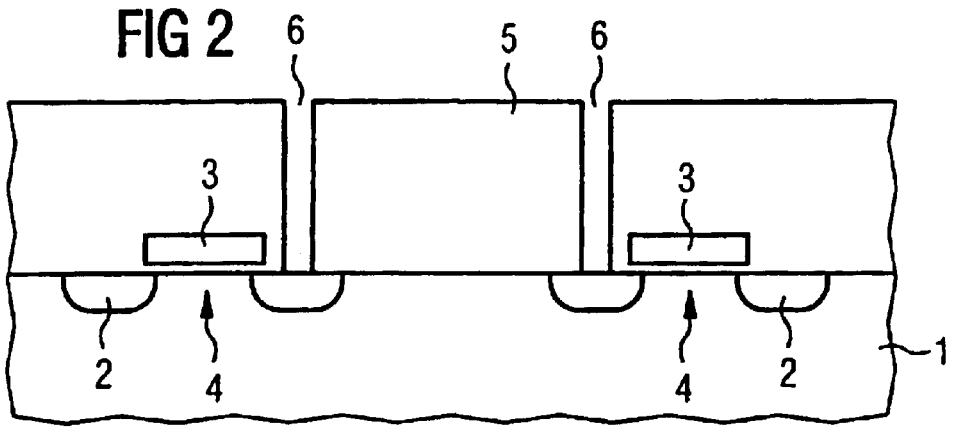

Subsequently, the via holes 6 are produced with a phototechnique. These via holes produce a connection between the transistors 4 and the storage capacitors that are yet to be generated. The via holes 6, for example, are generated by means of an anisotropic etching with fluorine-containing gases. The structure deriving therefrom is shown in FIG. 2.

Figure 3:
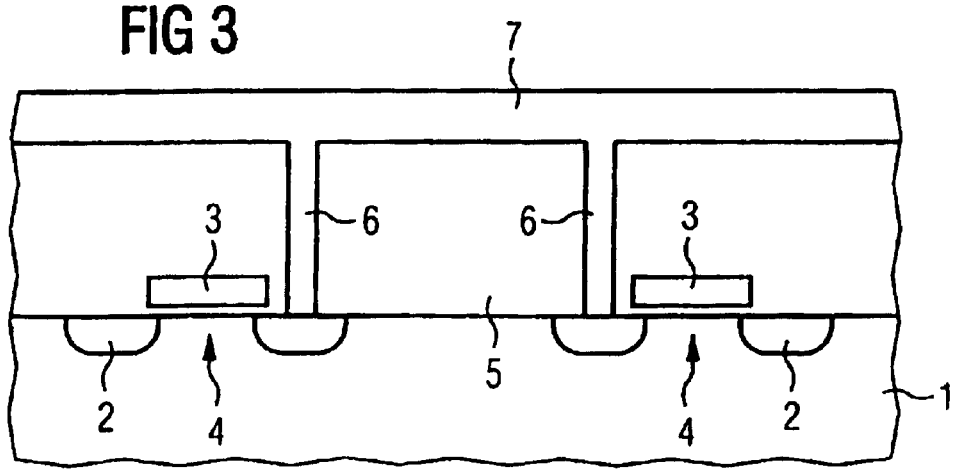
Figure 4:
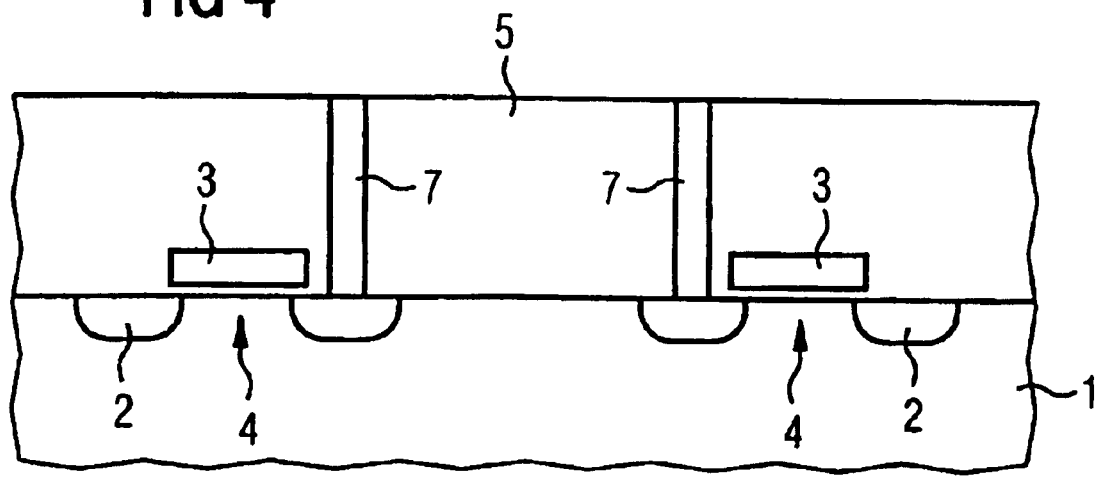

Subsequently, a conductive material 7, for example polysilicon doped in situ, is applied onto the structure. This can occur, for example, with a CVD process. Due to the application of the conductive material 7, the via holes 6 are completely filled and an interconnected conductive layer arises on the insulating layer 5 (FIG. 3). This is followed by a CMP step (chemical mechanical polishing) that removes the interconnected layer on the surface of the insulating layer and generates a planar surface. Only the polysilicon plugs 7' in the via holes remains (FIG. 4).

Figure 5:
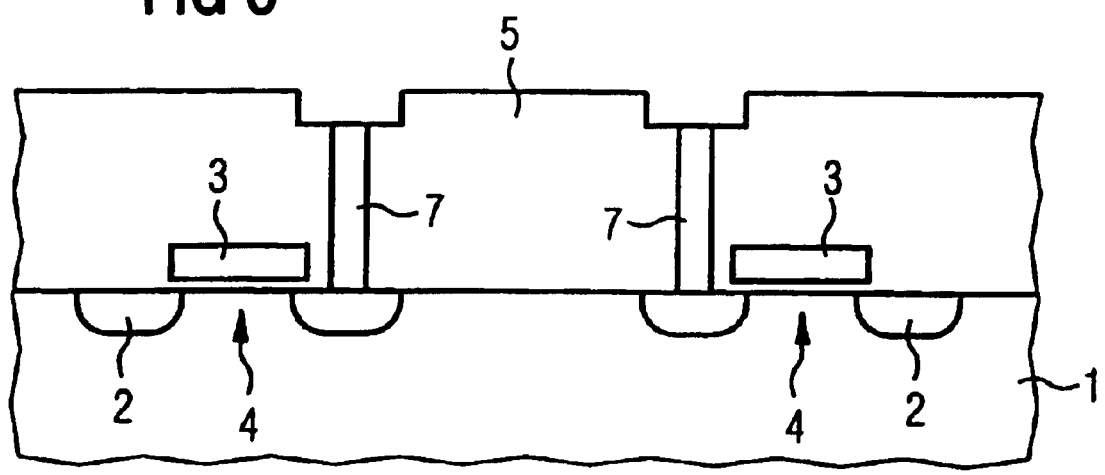
Figure 6:
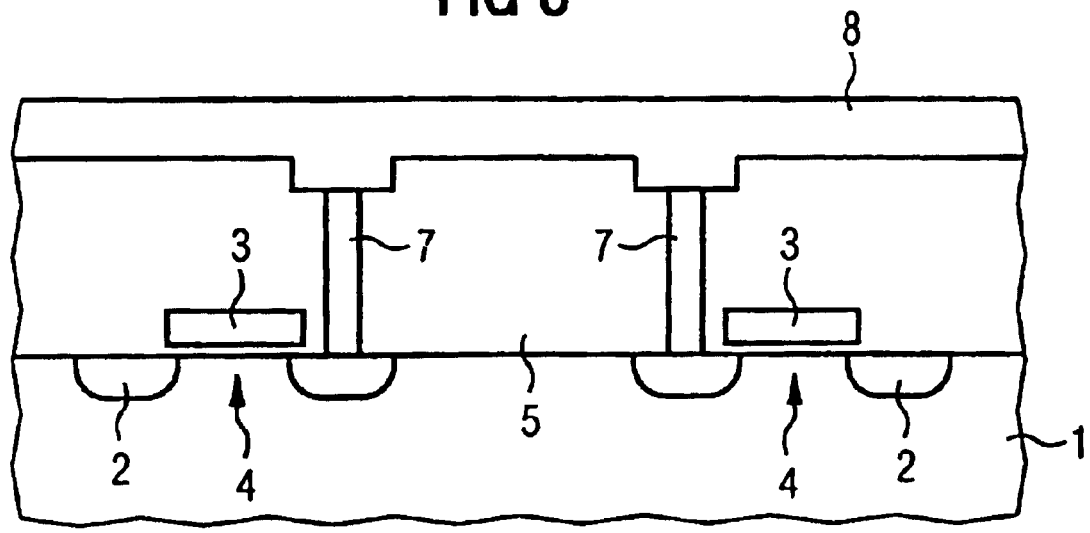

Thereafter, depressions are etched into the insulating layer 5 in a photolithographic way, and the depressions overlap with the via holes with the plugs 7' (FIG. 5). Accordingly, a first step of the inventive method has been completed and a substrate has been prepared. Moreover, the insulating layer 5 together with the depressions acts like a mask for structuring the iridium barriers that are yet to be produced.

Figure 7:
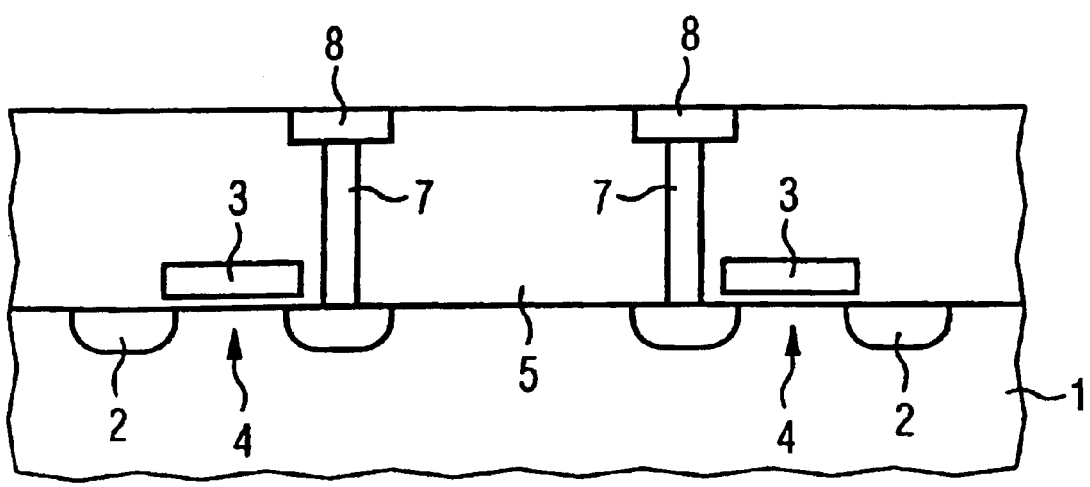

In order to fill these depressions in the silicon oxide 5 with Ir as a barrier material, a Ir layer 8 is first deposited surface-wide on the substrate. The generation of Ir layer 8 can, for example, occur by means of a sputtering of iridium. This is then followed by the inventive CMP step with which the Ir layer 8 is eroded down to the insulating layer 5 that serves as the mask (FIG. 7). In this way, the barriers 8' are generated above the polysilicon plugs 7'. After the production of the barriers 8', the lower electric, the dielectric/ferroelectric layer and the upper electrode are generated (not shown). Accordingly, a memory cell having a selection transistor and a storage capacitor has been produced. Thereafter, the metallization and the passivation of the component part can be generated in a known way.

Exemplary embodiments of the inventive chemical-mechanical polishing method are described below. An iridium layer is thereby chemical-mechanically polished on a substrate of silicon oxide.

Polishing systems of the type Westech 472 for 6-inch wafers were employed for all of the following exemplary embodiments. The erosion rates and the selectivity were measured on non-structured wafers.

Exemplary Embodiment 1

A suspension of aluminum oxide nano particles (CR 30 of the Baikowsky Company) in de-ionized water was prepared. Subsequently, ammonium cerium nitrate, $(NH_4)_2Ce(NO_6)_3$ as the oxidation agent and polyacrylic acid having a mol weight of approximately 2000 g/mol as the stabilizer were added to the suspension. The proportion of aluminum oxide particles amounted to 1% by weight and that of the ammonium cerium nitrate amounted to 10% by weight, and that of the polyacrylic acid amounted to 3% by weight. The pH value of the polishing fluid amounted to 1.5.

A polishing pad of the type Rodel IC1000 k-grooved on Suba IV was employed as support for the wafer. Alternatively, a polishing pad of the type Rodel IC1000 k-grooved on Suba IV only could be employed as well. A film of the type Standard Rodel T3 was employed as a "backing film".

The process parameters were set in the following way:
a.) Polishing pressure: 55.2 kPa (8 psi)
b.) Back pressure: 0 kPa (0 psi)
c.) Rotational velocity: Wafer carrier: 62 rpm Polishing plate: 65 rpm
d.) Polishing fluid flow rate: 100 ml/min Erosion rate and selectivity of the method are listed in Table 1.

Applied Example 2

A suspension of aluminum oxide nano particles (CR 30 of the Baikowsky Company) in de-ionized water was prepared. Subsequently, potassium chlorate, $KClO_3$, was added to the suspension as the oxidation agent. The addition of a stabilizer was foregone. The proportion of the aluminum oxide particles amounted to 1% by weight and that of the potassium chlorate amounted to 10% by weight. A polishing pad of the type Rodel IC1000 k-grooved on Suba IV was employed as support for the wafer. A film of the type Standard Rodel T3 was employed Ms the "backing film".

The process parameters were set in the following way:
a.) Polishing pressure: 41.4 kPa (6 psi)
b.) Back pressure: 0 kPa (0 psi)
c.) Rotational velocity: Wafer carrier: 62 rpm Polishing plate: 65 rpm
d.) Polishing fluid flow rate: 60 ml/min Erosion rate and selectivity of the method are listed in Table 1.

Exemplary Embodiment 3

A suspension of aluminum oxide nano particles (CR 30 of the Baikowsky Company) in de-ionized water was prepared. Subsequently, ammonium peroxide disulfate, $(NH_4)_2S_2O_8$ as the oxidation agent was added to the suspension. The addition of a stabilizer was foregone. The proportion of aluminum oxide particles amounted to 1% by weight and that of the ammonium peroxide disulfate amounted to 10% by weight. The pH value of the polishing fluid amounted to 4.

A polishing pad of the type Rodel IC1000 k-grooved on Suba IV was employed as support for the wafer. A film of the type Standard Rodel T3 was employed as "backing film".

The process parameters were set in the following way:
a.) Polishing pressure: 55.2 kPa (8 psi)
b.) Back pressure: 24.15 kPa (3.5 psi)
c.) Rotational velocity: Wafer carrier: 62 rpm Polishing plate: 65 rpm
d.) Polishing fluid flow rate: 100 ml/min Erosion rate and selectivity of the method are listed in Table 1.

Exemplary Embodiment 4

A suspension of aluminum oxide nano particles (CR 30 of the Baikowsky Company) in de-ionized water was prepared. Subsequently, hydrogen peroxide, $H_2O_2$ as the oxidation agent was added to the suspension. The addition of a stabilizer was foregone. The proportion of aluminum oxide particles amounted to 1% by weight and that of the hydrogen peroxide amounted to 5% by weight.

A polishing pad of the type Rodel Suba IV only was employed as support for the wafer. A film of the type Standard Rodel T3 was employed as the "backing film".

The process parameters were set in the following way:
a.) Polishing pressure: 55.2 kPa (8 psi)
b.) Back pressure: 0 kPa (0 psi)
c.) Rotational velocity: Wafer carrier: 62 rpm Polishing plate: 65 rpm
d.) Polishing fluid flow rate: 90 ml/min Erosion rate and selectivity of the method are listed in Table 1.

TABLE 1

| Example | Erosion Rate {nm/min} | Selectivity Ir:SiO$_2$ (TEOS) |
| --- | --- | --- |
| 1 | 30 | 30:1 |
| 2 | 14 | — |
| 3 | 20 | 20:1 |
| 4 | 60 | 1:2 |

The inventive method can be employed as a single-stage or as a two-stage or, respectively, multi-stage method. Given a single-stage method, work is carried out during the processing time with a fixed set of process parameters or, respectively, a prescribed polishing fluid. Given a two-stage or, respectively, multi-stage method, the process parameters and/or the polishing fluid are varied during the processing time. For chemical-mechanical polishing or iridium, for example, the start can be made with a method according to exemplary embodiment 4 and a switch to a method according to exemplary embodiment 1 can be made after a prescribed time. In this way, the overall processing time can be shortened and an adequate selectivity can nonetheless be assured.

What is claimed is:

1. A method for chemical-mechanical polishing of a layer on a substrate, said layer being composed of a metal selected from a group consisting of platinum metals, the method comprising the steps of preparing on a substrate a layer composed of a metal selected from the group consisting of platinum metals; preparing a polishing fluid containing 1 through 6 wt % of abrasive particles having a Mohs hardness of at least 9, 2 through 20 wt % of at least one oxidation agent selected from the group consisting of Ce(IV) salts, salts of chloric acid, salts of peroxodisulfiric acid, salts of hydrogen peroxide and hydrogen peroxide, and 74 through 97 wt % water; and chemical-mechanically polishing the layer of metal with the assistance of the polishing fluid.

2. A method according to claim 1, wherein the metal is iridium.

3. A method according to claim 1, wherein the polishing fluid additionally contains 2 through 10 wt % of a stabilizer selected from the group consisting of polyacrylic acid and derivatives of phosphonic acid.

4. A method according to claim 3, wherein the stabilizer is polyacrylic acid and has a mol weight of 500 to 10,000 g/mol.

5. A method according to claim 3, wherein the stabilizer amounts to between 2 and 5 wt % of the polishing fluid.

6. A method according to claim 1, wherein the polishing fluid contains 5 through 20 wt % of ammonium cerium nitrate, $(NH_4)_2Ce(NO_6)_3$ as the oxidation agent.

7. A method according to claim 1, wherein the polishing fluid contains 2 through 15 wt % of potassium chlorate, $KClO_3$ as the oxidation agent.

8. A method according to claim 1, wherein the polishing fluid contains 2 through 10 wt % ammonium peroxide disulfate, $(NH_4)_2S_2O_8$ as the oxidation agent.

9. A method according to claim 1, wherein the polishing fluid contains 2 through 10 wt % hydrogen peroxide as the oxidation agent.

10. A method according to claim 1, wherein the abrasive particles are in a range of 1 to 3 wt % of the polishing fluid.

11. A method according to claim 1, wherein the abrasive particles are selected from a group consisting of α-aluminum oxide, diamonds and a combination of α-aluminum oxide and diamonds.

12. A method according to claim 1, wherein the chemical-mechanical polishing step uses a polishing pressure of 3 to 12 psi.

13. A method according to claim 1, wherein the chemical-mechanical polishing step includes applying a pressure of 0 to 5 psi on a back side of the substrate.

14. A method according to claim 1, wherein the polishing step employs a wafer carrier for supporting the substrate with the layer of metal and a polishing plate, said plate and carrier body rotated at a rate of 20 to 70 rpm.

15. A method according to claim 1, wherein the flow rate of the polishing fluid on the layer of metal in the substrate is in a range of 50 to 150 ml/min.

16. A method according to claim 1, wherein the polishing fluid has a pH value greater than 1.

17. A method according to claim 16, wherein the pH value of the polishing fluid has a range of 2 to 12.

18. A method according to claim 1, wherein the step of preparing a layer of metal includes preparing a pre-structured substrate and then applying the layer of metal to at least sub-regions of a surface of the pre-structured substrate, and the step of chemical-mechanical polishing planarizes the layer of metal.

19. A method according to claim 18, wherein the step of preparing a pre-structured substrate includes applying a mask on the surface of the substrate.

20. A method according to claim 19, wherein the mask is a silicon oxide mask.

* * * * *